United States Patent [19]

Williams et al.

[11] 3,893,147

[45] July 1, 1975

[54] MULTISTATE VARACTOR

[75] Inventors: David W. Williams, Baltimore, Md.; Phillip L. Peyton, Falls Church, Va.

[73] Assignee: Westinghouse Electric Corp., Pittsburgh, Pa.

[22] Filed: Sept. 5, 1973

[21] Appl. No.: 394,600

[52] U.S. Cl. ........................ 357/14; 333/29; 357/36; 357/51

[51] Int. Cl. ................................................ H01l 5/00

[58] Field of Search.......... 317/234 UA; 357/51, 36, 357/14

[56] References Cited

UNITED STATES PATENTS 3,544,862 12/1970 Gallagher et al............. 317/234 UA

FOREIGN PATENTS OR APPLICATIONS 816,339 6/1969 Canada ......................... 317/234 UA

*Primary Examiner*—William D. Larkins
*Attorney, Agent, or Firm*—J. B. Hinson

[57] ABSTRACT

A multistate varactor is provided on a diffused semiconductor substrate having a plurality of spaced apart emitter zones forming PN junctions with a diffused base portion of the semiconductor. Interzone spacing between emitter zones permits control of two or more states of capacitance by applying a reverse bias voltage between the emitter and base of the device. The voltage-variable capacitor has a relatively high perimeter to area ratio, and interzone spacing is substantially less than the width of the zones to permit spreading of adjacent depletion layers together under reverse bias voltage across the PN junction. The device achieves an excellent figure of merit as to the ratio of high capacitance to low capacitance with a correspondingly low differential in the transition voltage between states. The semiconductor varactor can be made using existing diffusion and photomasking techniques, with a triple-diffused PNP device in a complementary bipolar process being preferred.

The multistate varactor can be used in phased array radar, frequency shift keying, voltage controlled oscillator, RF digital transmission, and multichannel voltage controlled tuner applications.

9 Claims, 9 Drawing Figures

MULTISTATE VARACTOR

BACKGROUND OF THE INVENTION

This invention relates to semiconductor capacitors of the type which is variable with applied voltage. These devices, known as varactors, are useful in circuit design for numerous purposes and can be manufactured by conventional integrated circuit techniques. It is known that a semiconductor PN junction exhibits capacitance due to the dielectric effect of the depletion layer existing in the vicinity of a PN junction or boundary. This depletion layer results from the impurity introduced by diffusing a dopant material in a semiconductor substrate, the concentration of impurity forming a gradient from a main surface of the semiconductor. This layer is a space charge region which is altered by applying a bias voltage across the PN junction. The bias potential is imposed in a reverse direction, with the positive input from the bias being connected to the N-terminal of the device and the negative input from the bias being connected to the P-terminal, when the imposed voltage is applied to the PN junction. With increasing voltage in the reverse direction across the junction, the depletion layer increases and the capacitance decreases. The capacitance is an inverse power function of the applied d-c bias voltage in the conventional prior art devices. The capacitance is related to the width of the space charge layer, and for bias voltages in the blocking or reverse direction this causes a variation in electrical characteristics. In an abrupt junction device wherein a homogeneously doped N region forms a semiconductor junction with a homogeneously doped P region, the capacitance-voltage relationship is that of inverse square root. In a diffused junction wherein the impurity concentration changes linearly across the semiconductor device, the capacitance of the PN junction varies inversely as the cube root of the d-c bias voltage, according to U.S. Pat. No. 2,991,371.

In certain circuits, it is desirable to produce a very rapid change of capacitance with applied bias voltage. Multistate varactors display at least two capacitance states separated by a transition voltage region in which the capacitance is reduced markedly with a relatively small difference in reverse bias voltage through the transition range.

Electronically controllable, rapid-acting microwave phase shifters are finding use in phased-array radar and communication systems, providing technical feasibility of phased-array systems. In these systems, a phase shifter is inserted in series with each radiator of an array of antennas. The radiating-phase-front direction can be controlled by varying the time delay from the source of a common signal to each element of the array. The common signal can be derived either from a single high power source or a low power, phase-locked source mounted in each array element. Frequency independent beam steering is obtained by nondispersive phase shifters. This type of circuit is essentially a switchable length of transmission line with power handling capability determined only by the microwave switching circuits.

SUMMARY OF THE INVENTION

A new semiconductor multistate device has been discovered for use as a voltage-variable capacitor. This device can be made with existing monolithic integrated circuit methods for diffused conductivity regions. A multistate varactor according to the present invention includes a semiconductor substrate having a diffused P-type conductivity region and a diffused N-type conductivity region with a PN-type junction formed between the two types of regions. One of these diffused conductivity regions is separated into a plurality of zones having relatively high perimeter-to-area ratio and having an interzone spacing sufficiently close to permit spreading of the depletion layer from one zone into the depletion layer of another adjacent zone in response to a reverse bias voltage across the PN junction.

It has been found that interzone spacing of about 1 to 5 microns between emitter zones provides multistate capacitance in typical semiconductor materials. Varactors having binary, tertiary and higher states can be constructed wherein the interzone spacing is varied. Transition voltage between states is determined by the spacing.

Compared to prior art devices, such as MOS varactors, the new multistate devices are easily manufactured by photomasking methods which can produce controlled emitter zone dimensions. Excellent electrical characteristics, such as dC/dV and $C_H/C_L$ ratios, are achieved.

DESCRIPTION OF PREFERRED EMBODIMENTS

In describing the preferred embodiments of this invention, reference is made primarily to PNP-type semiconductor systems, and especially to those systems having a doped silicon substrate. Referring to FIGS. 1*a* – 1*d*, a diffused P-type silicon semiconductor material 10 having a main surface is diffused with an N-type material in conductivity region 12, and a film of insulating material 14 is formed thereon. An ohmic contact to the substrate 10 provides a P-type collector.

Figure 1A:
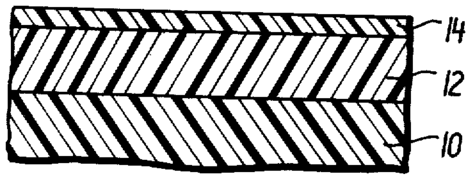
FIGS. 1*a* to 1*d* show a vertical cross section view partially cut away of a particular semiconductor substrate and subsequent layers which are developed to make the novel varactor device.
Figure 1B:
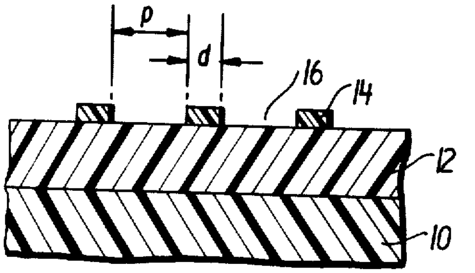
Figure 1C:
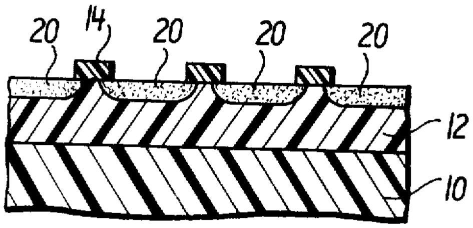
Figure 1D:
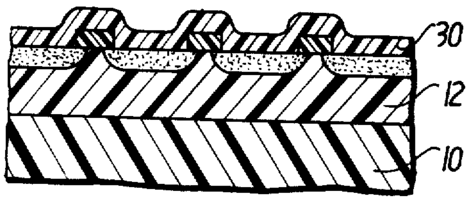

In FIG. 1*b* openings 16 in the insulating film 14 are formed by conventional processes, such as etching. In the case of a silicon substrate, a film 14 can be formed by thermal oxidation of the main surface to produce a $SiO_2$ insulator. Openings 16 in the oxide layer can be formed by photomasking and selective etching of the silicon dioxide layer (FIG. 1*b*). The oxide is permitted to remain in those areas where final P-type diffusion is not desired. Diffusion of dopant material into layer 12 through openings 16 can be effected by existing methods, such as boron vapor deposition and thermal diffusion. Typical prior art processes, such as those described in U.S. Pat. No. 3,173,814, may be used. The width p of the emitter zones is determined by the opening in the photomask used in the etching step (FIG. 1*b*). Interzone spacing d predetermines critical electrical characteristics of the semiconductor device. After the diffusion process for doping emitter zones in FIG. 1c a plurality of emitter zones 20 are present in the semiconductor main surface. These emitter zones may be individually connected with ohmic contacts. A preferred embodiment is shown in FIG. 1d wherein an electrically conductive metal 30, such as aluminum, is deposited over the emitter portion on the main surface of the varactor device. Layer 30 provides an ohmic electrical connection to each emitter zone 20, but is separated from base portion 12 by insulating layer 14. The ohmic contact is then connected by a lead to the electrical source. Individual contacts may be provided for each emitter zone, if desired.

The preferred semiconductor substrate for use herein is P-doped silicon, germanium or gallium arsenide wafers. The preferred N-type diffusion materials for this substrate are arsenic and antimony. The preferred P-dopant is boron. A corresponding NPN-type semiconductor can also be fabricated using existing diffusion technology.

Figure 2:
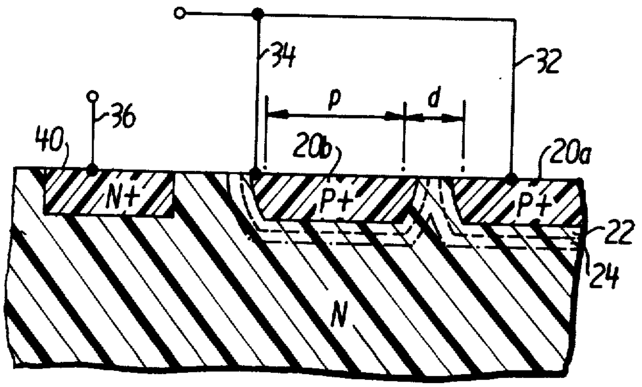
FIG. 2 is a schematic diffused zone varactor according to the present invention.

Referring now to the schematic representation in FIG. 2, a portion of the main surface of a diffused semiconductor substrate is shown in cross section. A plurality of P+ emitter zones 20*a*, 20*b* are diffused into the N-doped substrate surface of the varactor device. A $P^+$ emitter zone 20*a* has a depletion layer 22 extending from the PN junction. An adjacent emitter zone 20*b* has a corresponding depletion layer. These depletion layers are separate, i.e., spaced apart, at low bias voltage. The planar area of depletion layer 22 corresponds to the projected area under mask openings 16 in FIG. 1*b*. The sidewall area of depletion layer 22 extends from the edge of the planar area upwardly to the substrate surface. In a diffused varactor of the type desired, capacitance for an individual zone at low bias voltage is the sum of sidewall capacitance and planar capacitance. The planar capacitance on a unit area basis is smaller than the corresponding sidewall capacitance due to the concentration difference between P materials and the N materials in diffused semiconductor devices. Electrical leads 32, 34 are connected to emitter zones 20*a*, 20*b* respectively, through ohmic contacts. The base portion of the varactor device is connected to a lead 36. Preferably, an $N^+$ conductivity region 40 is diffused into the N-type base 12 and is provided with an ohmic contact to which lead 36 is connected. Alternatively, the base may be provided with a direct ohmic contact for lead 36. Emitter leads 32, 34 are shown interconnected in FIG. 2, and, with lead 36, provide a means for imposing a reverse bias potential across the PN junction when the leads are connected to a suitable source of direct current potential.

When leads 32, 34 are connected to the negative terminal of a d-c power source, and lead 36 is connected to the positive terminal, a reverse bias potential is provided across the PN junction. As the bias potential is increased, the depletion layer 22 spreads outwardly from the PN junction. At low bias potential the sidewall depletion layers between emitter zones 20*a*, 20*b* are spaced from one another. This condition corresponds to the first capacitance state of a multistate varactor. As the reverse bias voltage is increased, the depletion layers spread further out from the emitter zones until at the transition voltage $V_T$, a second capacitance state is reached, as represented by depletion layer 24, extending outwardly. Above the transition voltage $V_T$ the depletion layers of adjacent emitter zones 20*a*, 20*b* spread together, substantially eliminating sidewall capacitance between zones. In the second state the total capacitance becomes essentially the sum of each planar area capacitance plus the capacitance of the end sidewalls.

A suitable power source for applying the bias potential is a battery with variable output up to about 8 VDC. Typically, transition voltages of about 2 – 6 volts are employed in the novel multistate varactors. The bias voltage is applied across the PN junction by connecting the power source to the leads, as shown in FIG. 2.

The collector portion of the semiconductor device may be connected by a suitable lead to either the emitter leads or the base lead. The collector terminal should ordinarily not be permitted to float electrically. In the examples described below the collector lead is connected to the emitter lead in the test circuit.

An experimental structure was made using a triple-diffused PNP configuration in a complementary bipolar process. This structure was made with emitter zones of 16 parallel stripes about 8 – 9 microns wide with 4 micron interzone spacing. The starting material is a 10 – 40 Ωcm boron doped P-type silicon wafer mechanically and chemically polished to a thickness of 10 – 11 mils. An initial $SiO_2$ oxidation layer of 6000 A is grown at 1200°C, followed by photomasking using conventional integrated circuit photoengraving techniques. Arsenic is then diffused to a depth of about 7.3 microns, giving a sheet resistivity of 45 ohms per square. The $SiO_2$ is removed by etching and an arsenic-doped epitaxial layer is grown to a thickness of 14 microns, giving a resistivity of 1.2 ohm - cm. The wafer is then oxidized to a thickness of 4000 A at 1200°C. It is important that oxide thicknesses from the start be kept as thin as possible to minimize the oxide buildup during subsequent furnace operations. Otherwise it may be impossible to prevent undercutting during the oxide etch portion of the photoengraving process. After oxidation, the wafer is photomasked to form the P-regions which constitute the collector of the varactor. The P-diffusion is diffused to a final resistivity of 550 ohms per square and a depth of 8.2 microns. The sheet resistivity obtained in deposition is 90 – 100 ohms per square. The wafer is reoxidized at 1200°C to a thickness of 6000 A. Final drive-in is done simultaneously with the subsequent isolation drive-in.

The next mask opens the region around the epitaxy tubs for the isolation diffusion. The isolation deposition is done for 60 minutes at 1150°C. After 16 hours drive-in at 1200°C, the P-diffusion is evaluated and should be 550 ±50 ohms per square and 8.2 microns deep.

The 4th mask opens the varactor base region and all other n-type regions such as resistor tub contacts and the NPN collector contact. It should be noted that whenever possible all regions of the same type as the diffusion to follow should be opened during any given photoetching. This keeps oxide thicknesses in all regions to a minimum and greatly reduces etch times and undercutting in subsequent photoetching.

An n-type arsenic base diffusion is done for the varactor to achieve deposition resistivity of 250 ohms per square, followed by a 5-minute oxide etch and drive-in. Final resistivity is 150 ohms per square and final depth is 2 microns. The 5th mask is the NPN base and resistor mask. A boron doped diffusion is done to achieve a sheet resistivity of 200 ohms per square and junction depth of 1 micron.

The wafer is then diffused to give the $P^+$ emitter for the varactor. This diffusion is not more than about 10 ohms per square and 1.7 microns deep. After diffusion, the wafers receive 3400 A pyrolytically deposited $SiO_2$. The wafers then receive a mask for the $N^+$ varactor base contact and NPN emitter. The $N^+$ diffusion is less than about 10 ohms per square and 1 micron deep. Next, the wafers receive 5000 A pyrolytically deposited phosphorusdoped passivating $SiO_2$. Aluminum is deposited over the electrode areas through a contact window mask by electron beam evaporation to 10,000 A thickness, and ohmic contacts and interconnections are then formed. After sintering at 500°C for 20 minutes, the units are ready for probe test, scribe and dice, and packaging.

Figure 3:
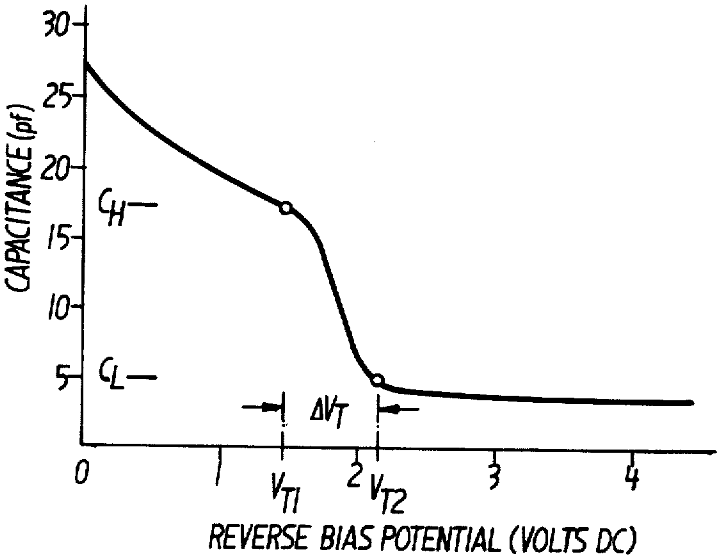
FIGS. 3 and 4 are electrical characteristic curves for binary varactors showing capacitance plotted against reverse bias voltage.

The transition voltage ($V_T$) for this device is about 2 volts d-c, and the transition takes place over a differential ($\Delta V_T$) of about 0.6 volts, as shown in FIG. 3. This experimental varactor was tested with a Tektronix LC meter, which applies a 1 megacycle 0.8 VAC measuring signal, and a sweep supply which applies a reverse bias voltage sweep of 0 – 8 VDC.

Referring to FIG. 3, as the reverse bias voltage is increased, the capacitance decreases in the first state as an inverse power function of voltage. At a transition voltage $V_{T1}$, the capacitance curve for state one becomes discontinuous as the depletion layer begins to spread together in the varactor. In the transition range $\Delta V_T$, the capacitance drops sharply with increasing voltage. A second state is reached at $V_{T2}$, and the capacitance drops slowly with increasing voltage.

Figure 4:
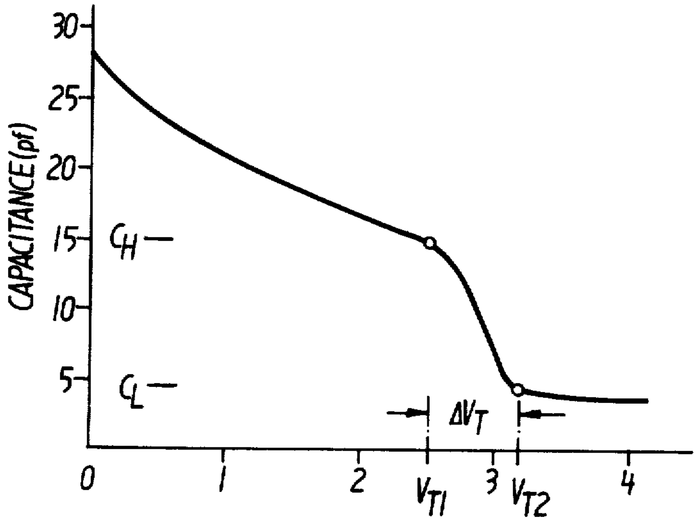

A second experimental structure was made in a manner similar to that above, except that the 16 emitter stripes are separated by an interzone spacing of about 5 microns. This varactor was tested and the electrical characteristic plot is shown in FIG. 4. As compared to the first varactor, the 5-micron structure has a wider first state, with a higher critical voltage being required to reach the transition between states. The voltage differential is approximately the same as for the first varactor.

Closer interzone spacing will result in a lower reverse bias potential required to reach the transition point between states. The interzone spacing may be as little as 1 micron and as great as 5 microns. The emitter zones should be at least 7 microns wide for desirable varactors having more than one capacitance state. The interzone spacing is substantially less than the emitter width. Uniform spacing between a plurality of emitters permits spreading together of adjacent depletion layers at a predetermined transition voltage. Close control of interzone dimensions results in a narrow $\Delta V_T$ and a high value for the figure of merit. A figure of merit, describing the variability of capacitance with reverse bias voltage, for any variable capacitance device can be defined as:

$$\beta_{CV} = \frac{C_H/C_L}{K|\Delta V_T|} \qquad \left(K = \frac{1}{\text{Volts}}\right)$$

where $C_H$ and $C_L$ are the capacitance values at the ends of the voltage range described by $\Delta V_T$. A typical prior art tuning varactor will have a $\beta_{CV}$ of about 0.1 to 1.0, when measured in transition voltage between $V_{T1}$ and $V_{T2}$. The values of $C_H$, $C_L$, $V_{T1}$ and $V_{T2}$ can be determined graphically using standard plotting methods. The binary varactors according to this invention achieve a figure of merit substantially greater than 1, with values of 5 and higher being obtainable.

As used herein, the term "multistate" includes varactors having three or more capacitance states, such as tertiary or higher capacitance states. Configurations for emitter zones for multistate varactors according to the present invention can be designed for numerous different types of manufacturing methods. Photomasking is preferred because of the excellent control of interzone dimensions which can be obtained. The emitter zones may be a series of closely spaced elongated bars or stripes, rectangles, squares or other polygon shape. A grid pattern of square emitter zones gives a high perimeter:area ratio, which is desirable for such varactor devices. The value of high perimeter:area ratio in diffused integrated semiconductors is described in U.S. Pat. No. 3,544,862 to Gallagher and Williams, which provides a structure having a transistor element and an interdigitated capacitor element.

In addition to rectilinear configurations, emitters in a spiral shape with uniform spacing between turns can produce a binary varactor similar in characteristic to that of the parallel stripe configuration. Concentric circular emitters are also feasible. Where a binary varactor is described with narrow $\Delta V_T$, uniform interzone spacing is necessary. However, where multiple states higher than two are required, the interzone spacing varies. The transition voltage ($V_T$) has been found to be proportional to the square of the interzone dimension ($V_T = kd^2$). Configurations having other than equal and parallel spacing between emitter zones produce multistate varactors. By making spacing d different between parallel stripes, the transition voltage between capacitance states can be controlled. By varying the interzone spacing slightly between a number of emitter zones, a piecewise linear region can be formed incrementally over a wide capacitance ratio.

Figure 5:
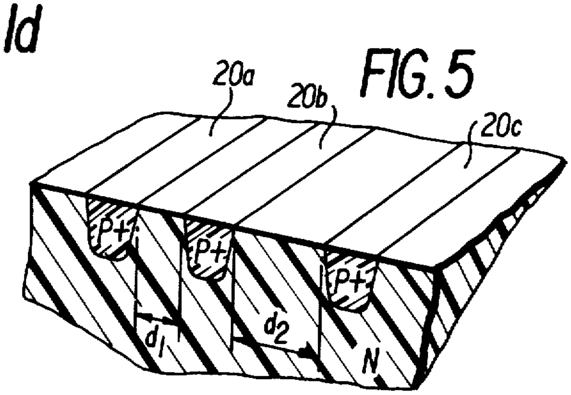
FIG. 5 is an isometric schematic representation of a tertiary varactor according to the present invention.
Figure 6:
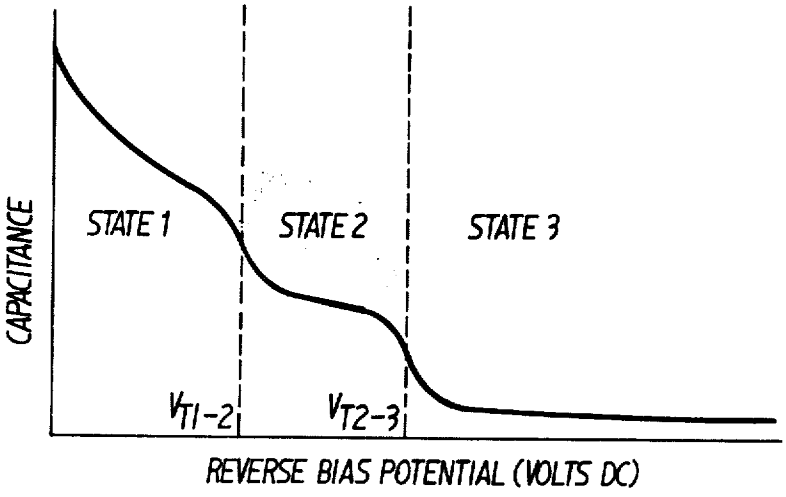
FIG. 6 is an electrical characteristic curve similar to FIGS. 3 and 4 for a tertiary varactor.

A typical higher number multistate varactor device is shown schematically in FIG. 5, wherein three emitter zones 20a, 20*b*, 20*c* are diffused into a semiconductor substrate. Emitters 20a and 20b are separated by interzone spacing $d_1$, whereas emitter zones 20b and 20c are separated by a wider interzone spacing $d_2$. The transition voltage $V_{T1\text{-}2}$ required for spreading the depletion layers together between zones 20a and 20b will determine the interface between state 1 and state 2, as shown in FIG. 6. A higher bias voltage is required for spreading the depletion layers together between emitter zones 20b and 20c. A second transition voltage $V_{T2\text{-}3}$ is required to extend the capacitance into state 3. Thus, a tertiary varactor is made having three distinct capacitance states.

There are several applications for the unique varactor device of this invention. In The Microwave Journal, May 1970, pp. 45–48, Siegal describes several circuit applications for binary varactors. The very high values of $\beta_{CV}$ allow the design and construction of wideband voltage-controlled oscillators and filters for which only a small value of control voltage swing is required to cover the desired frequency range. This can be of prime importance in wideband avionic systems which must operate off an aircraft line voltage. The d-c to d-c converters used to obtain high voltage for conventional high capacitance ratio tuning varactors can now be eliminated, thereby reducing system cost, size, weight, complexity and RFI problems. Operation in the transition range should also be suitable for wide deviation FM oscillators and detectors.

Multistate varactors can be used for analog to digital transformation, RF digital transmission, frequency shift keying, phased-array radar, doppler radar, and multichannel voltage controlled FM and UHF tuners in typical applications. The high values of $C_H/C_L$ and small $\Delta V_T$ permit design and construction of wideband voltage-controlled oscillators and filters which required only a small value of control voltage swing to cover a desired frequency range. Other uses for voltage-variable multistate capacitors having a figure of merit greater than 1 will be obvious to the skilled designer.

In manufacturing the new multistate varactors, prior art planar diffusion process can be used in a compatible system. The devices can be included in microcircuits using available monolithic integrated circuit methods.

While the invention has been described by particular examples, there is no intent to limit the inventive concept except as set forth in the following claims.

What is claimed is:

1. A multistate voltage-variable capacitor comprising a semiconducting substrate having a main surface; a diffused portion with a concentration gradient decreasing inwardly from the main surface; at least three spaced-apart diffused first zones forming corresponding PN junctions with the said portion of the capacitor, successive ones of said first zones being separated by corresponding, different interzone spacings, each of not more than 5 microns and establishing for the associated, adjacent ones of said first zones, first and second capacitance states having a predetermined transition voltage therebetween with respect to a reverse bias voltage applied between said first zones and the said portion, and the successive spacings differing respectively in amount thereby to establish corresponding, different transition voltages; and means for applying a selectively adjustable reverse bias voltage between the said portion and said first zones for controlling the capacitance of said capacitor in accordance with said capacitance states and said corresponding, different transition voltages.

2. The capacitor of claim 1 wherein said substrate comprises a P-type semiconductor, the said portion is formed by an N-type diffusion through said main surface of said substrate, and said first zones comprise diffused P+ first zones.

3. The capacitor of claim 2 wherein the substrate consists essentially of P-type silicon and where the first zones are diffused into planar regions of the diffused N-type portion with a concentration gradient decreasing inwardly from the main surface, thereby forming sidewalls in the first zones, said sidewalls having a higher capacitance per unit area than the corresponding planar regions.

4. A semiconductor multistate device for use as a voltage variable capacitor comprising a semiconductor substrate having a main surface and including a first conductivity-type region diffused therein from said main surface and an opposite conductivity-type region comprising at least three spaced zones diffused into said first conductivity-type region, said at least three zones each defining a PN-type junction with said first conductivity-type region and each of said zones having a relatively high perimeter:area ratio, successive ones of said zones being separated by interzone spaces each thereof substantially less than the width of said zones and sufficiently closely spaced to permit spreading of the depletion layer of a given said zone into the corresponding depletion layer of an adjacent zone at a corresponding, transition value of reverse bias voltage applied to the PN junction of said adjacent zone and the successive interzone spacings between successive said zones differing respectively in amount to define corresponding, different transition voltages; means for applying a bias voltage across said PN junctions, whereby increasing reverse bias voltage across the PN junctions formed by said zones causes the corresponding depletion layers of adjacent zones to spread together at corresponding, different predetermined transition voltages, said spreading substantially reducing interior sidewall capacitance between the successive, corresponding zones.

5. The device of claim 4 wherein the semiconductor substrate is a P-type semiconductor.

6. A multistate voltage-variable capacitor comprising:

a semiconductor substrate of one conductivity type;

said substrate having diffused therein at least three zones having an opposite conductivity type, successive said zones being spaced apart by different amounts thereby defining corresponding, different interzone spacings, said zones and said substrate forming a plurality of PN junctions; and means for applying a selectively variable electric potential between each of said zones and said substrate thereby to establish a reverse bias across each of said PN junctions, each said zone developing a depletion layer in said substrate which increases in extent as a function of the magnitude of the reverse bias, and successive said zones being spaced whereby the depletion layer for each zone overlaps the depletion layer for a next adjacent zone at a predetermined voltage, the successive, different interzone spacings defining successive, different predetermined voltages at which the respective depletion layers of said successive, adjacent zones overlap.

7. A multistate voltage-variable capacitor as in claim 6 wherein said zones are electrically interconnected.

8. A multistate voltage-variable capacitor as in claim 7, wherein said zones contain an impurity concentration gradient.

9. A multistate voltage-variable capacitor as in claim 7, wherein said PN junctions between said zones and said substrate include planar areas and sidewall areas, said sidewall areas being larger than said planar areas.

* * * * *